(12) United States Patent
Koyama (10) Patent No.: US 6,664,165 B2
(45) Date of Patent: Dec. 16, 2003

(54) SEMICONDUCTOR DEVICE AND FABRICATION METHOD THEREFOR

(75) Inventor: Kazuhide Koyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/240,347
(22) PCT Filed: Jan. 31, 2002
(86) PCT No.: PCT/JP02/00791
§ 371 (c)(1), (2), (4) Date: Oct. 1, 2002
(87) PCT Pub. No.: WO02/061846
PCT Pub. Date: Aug. 8, 2002

(65) Prior Publication Data
US 2003/0104661 A1 Jun. 5, 2003

(30) Foreign Application Priority Data
Feb. 1, 2001 (JP) .......... 2001-25273

(51) Int. Cl.[7] .......... H01L 21/331; H01L 21/8222; H01L 21/00
(52) U.S. Cl. .......... 438/311; 438/162; 438/407; 438/775
(58) Field of Search .......... 438/311, 162, 438/164, 407, 412, 766, 775

(56) References Cited

U.S. PATENT DOCUMENTS 5,972,777 A * 10/1999 Hsu et al. .......... 438/440
6,225,151 B1 * 5/2001 Gardner et al. .......... 438/162
6,229,184 B1 * 5/2001 Riccobene .......... 257/368
6,528,434 B2 * 3/2003 Chen .......... 438/787

FOREIGN PATENT DOCUMENTS

| JP | 05-206421 | 8/1993 |
| JP | 07-273188 | 10/1995 |
| JP | 11-135615 | 5/1999 |
| JP | 2000-269320 | 9/2000 |

* cited by examiner

Primary Examiner—John F. Niebling
Assistant Examiner—Viktor Simkovic
(74) Attorney, Agent, or Firm—Sonnenschein, Nath & Rosenthal LLP (57) ABSTRACT

There is provided a semiconductor apparatus, and a fabrication method thereof, which are improved such that a reduction in concentration at the SOI active layer is prevented, and a parasitic MOSFET is not formed even in cases where Mesa-type isolation techniques and the STI isolation method are applied to form a MOSFET in an SOI layer. In an isolation step for separating and forming a plurality of device regions, a layered film of a nitride film ($Si_3N_4$) and an oxide film ($SiO_2$) is taken as an isolation mask, and a semiconductor layer (SOI layer) is removed from the isolation region by etching. Subsequently, a SiON film (7) is formed on a sidewall surface of an SOI layer (3) by a nitridation oxidation process. Thereafter, isolation is performed by the STI method. Finally, an oxide film (9) and an electrode (10) are formed, and a MOSFET is completed.

9 Claims, 8 Drawing Sheets

SEMICONDUCTOR DEVICE AND FABRICATION METHOD THEREFOR

TECHNICAL FIELD

This invention relates to a semiconductor apparatus in which a MOS transistor is formed in a device region separated by an isolation region and to a method of fabricating same. In particular, it relates to a novel method of suppressing the diffusion of impurities with respect to an insulation substrate at an end portion of an SOI active layer in an SOI-type semiconductor apparatus.

BACKGROUND ART

With the progress in the miniaturization of semiconductor integrated circuits in recent years, SOI (Silicon On Insulator) structures, in which the junction capacitance between a substrate and a junction section (junction) is reduced and power consumption is lowered by providing an insulator between a silicon substrate and a MOS transistor, is attracting attention. In such an SOI-type semiconductor apparatus, because isolation between the devices is performed with a silicon oxide layer as an insulation layer, even in an SOI-type semiconductor apparatus with a high degree of integration, soft errors and latch-ups can easily be suppressed, and a high reliability can be secured. Further, in an integrated circuit apparatus having an SOI structure, because the junction capacitance of an impurity diffusion layer in a device region can be reduced, charge and discharge currents which accompany switching becomes lower, and it becomes more advantageous in attempting to increase speed, and to lower power consumption.

In an SOI-type semiconductor apparatus, a process similar to that of forming a transistor on an ordinary bulk silicon wafer may be applied to the gate structure and wiring process or the like in forming a transistor in a device region. However, when performing isolation in an SOI-type semiconductor apparatus applying the conventionally well known LOCOS (Local Oxidation of Silicon) method, because field oxidation speed has pattern dependence, the following problems were present in employing a process applied to ordinary bulk silicon wafers.

Below, a conventional isolation method is described with reference to the drawings.

Figure 6:
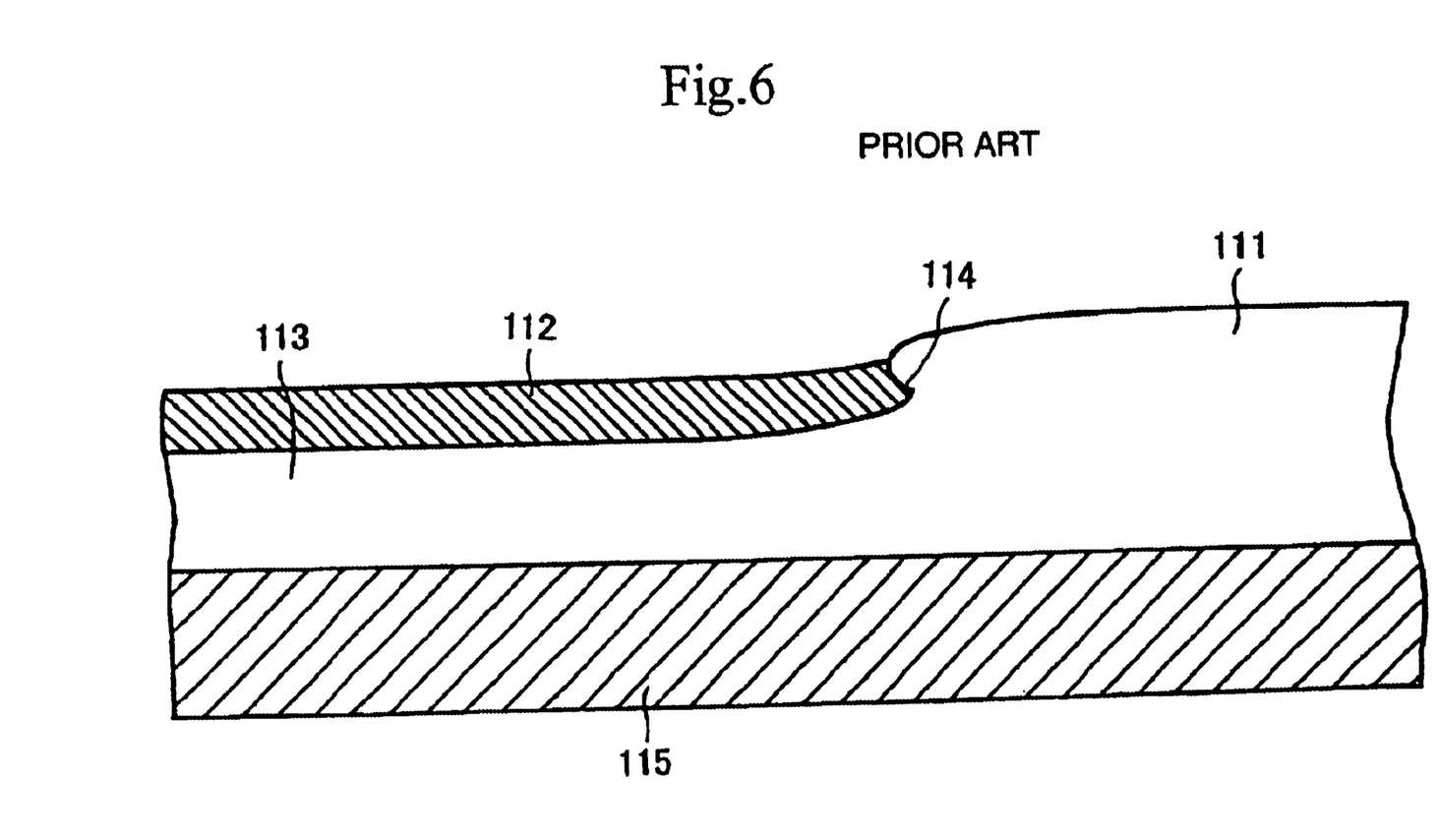
FIG. 6 is a sectional view of a semiconductor apparatus for explaining isolation for a conventional SOI-type semiconductor apparatus by the LOCOS method.

FIG. 6 is a sectional view of a semiconductor apparatus, which describes isolation for a conventional SOI-type semiconductor apparatus by the LOCOS method. A LOCOS oxide film 111 is formed through selective oxidation with a patterned nitride film as a mask. When the LOCOS oxide film reaches a buried oxide film in a narrow isolation region and oxidation is advanced until isolation is complete, in the LOCOS oxide film of a wide isolation region, as shown in FIG. 6, an SOI layer 112 is affected by oxidation due to a wraparound from a buried oxide film 113 and transforms to resemble a bird's beak at a portion 114 in contact with the isolation region. 115 is a silicon substrate. When the SOI layer 112 transforms, there was a problem in that stress deflection (stress) from the transformed portion 114 is facilitated, crystal defects are formed in the device region of the SOI layer 112, bringing about a leakage between a source and a drain. Further, with the miniaturization of circuitry, as in ordinary bulk silicon wafers, the critical dimension loss at an end portion of the LOCOS becomes a problem.

Thus, as an isolation method for an SOI-type semiconductor device that mitigates the problem of stress in the LOCOS method or the problem of critical dimension loss, the STI (Shallow Trench Isolation) method and Mesa-type isolation technique are being favored.

Figure 7:
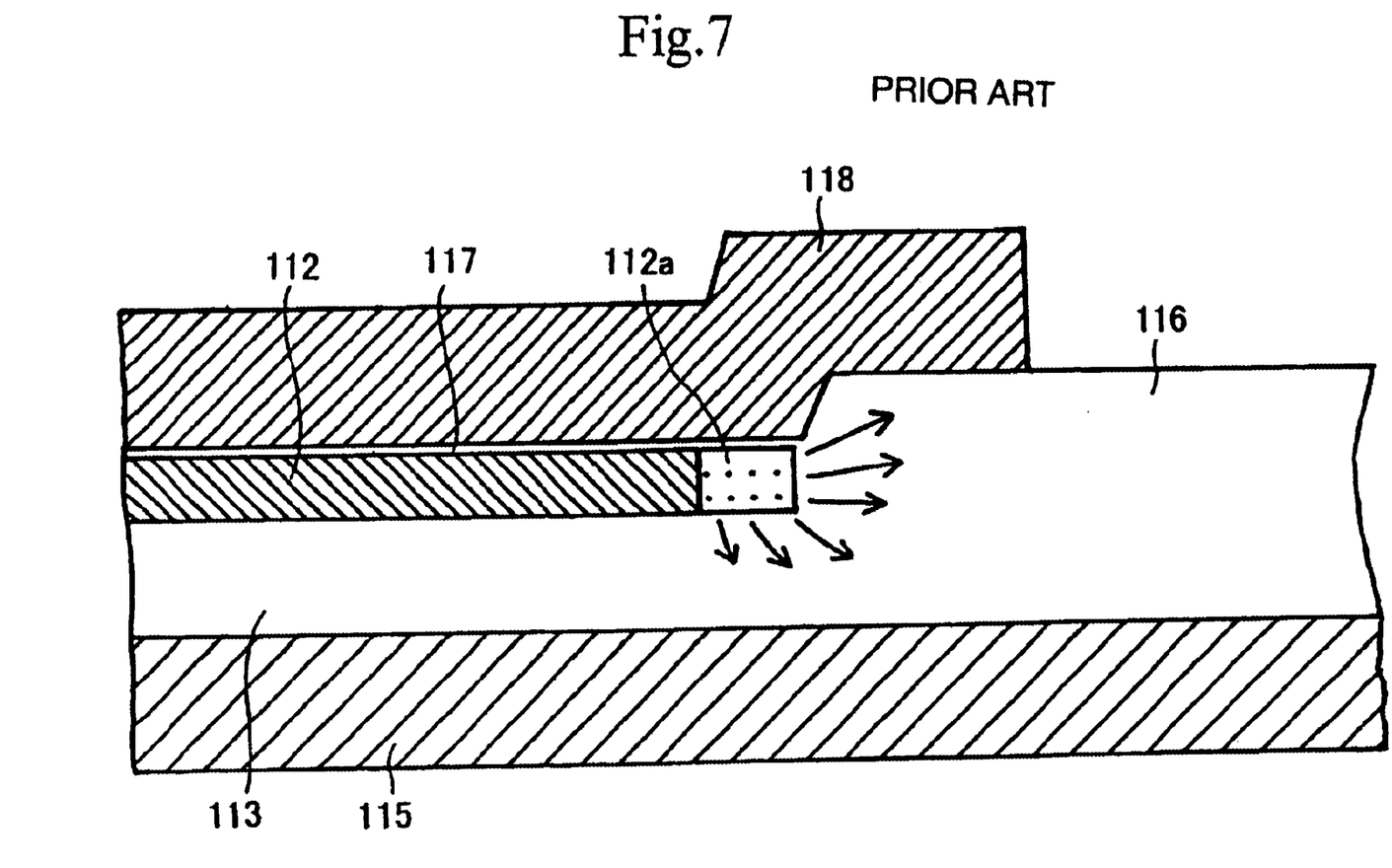
FIG. 7 is a sectional view of a semiconductor apparatus for explaining the isolation in an SOI-type semiconductor apparatus by a conventional STI-type isolation method.

FIG. 7 is a drawing illustrating the structure of a cross-section of an SOI-type semiconductor apparatus to which STI isolation is applied. In the STI isolation method, after an SOI layer 112 is processed to form an island-shaped device forming region, the isolation region is buried with an STI insulation film 116, and the surface is planarized by chemical mechanical polishing (CMP). Subsequently, an isolation mask is removed. 117 is a gate oxide layer and 118 is a gate electrode. This STI isolation method is often applied to SOI-type semiconductor devices in which the SOI layer 112 is formed in a thickness of 50 nm or above.

Figure 8:
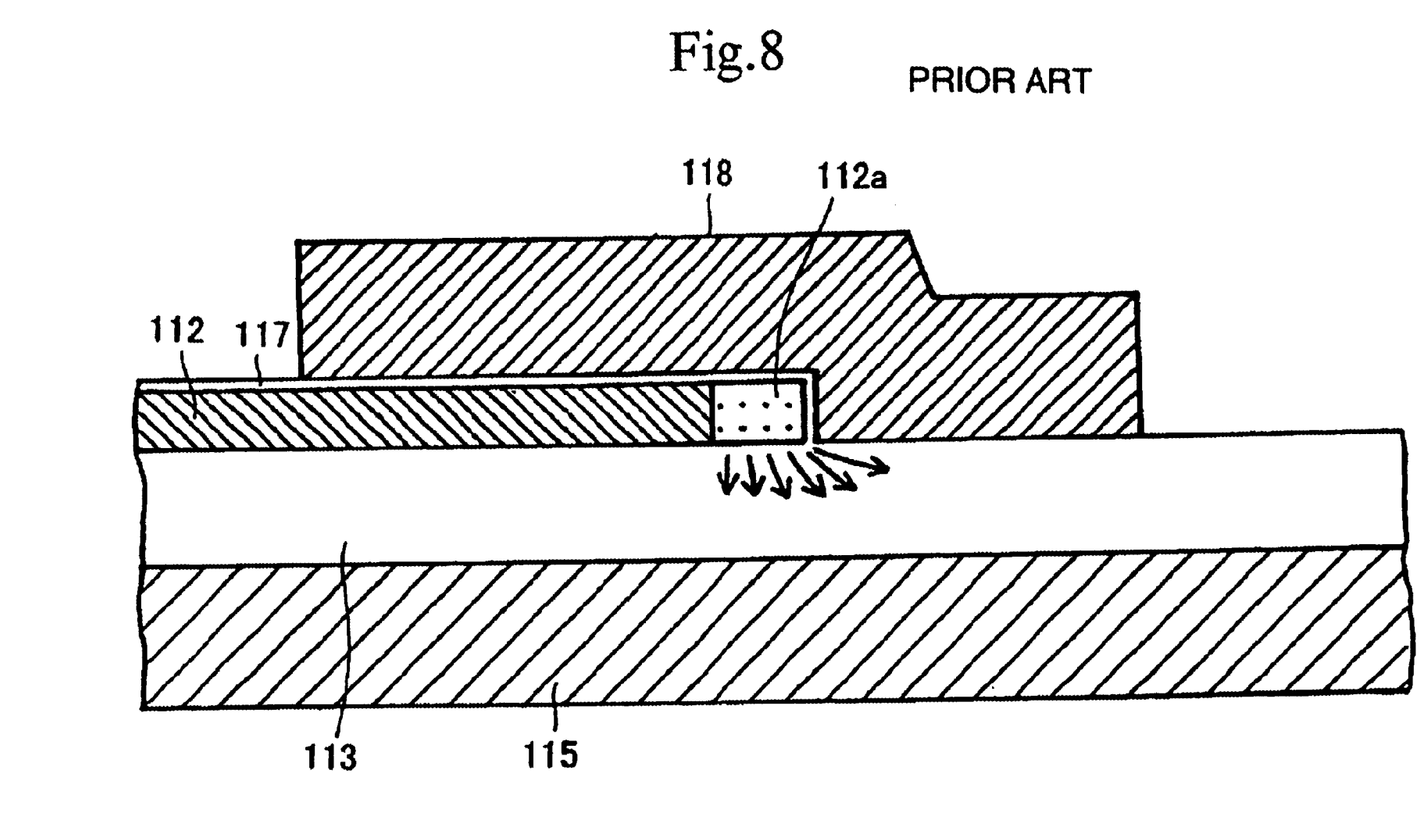
FIG. 8 is a sectional view of a semiconductor apparatus for explaining the isolation in an SOI-type semiconductor apparatus by a conventional Mesa-type isolation method.

FIG. 8 is a drawing illustrating the structure of a cross-section of an SOI-type semiconductor apparatus to which Mesa-type isolation is applied. In Mesa-type isolation techniques, an SOI layer 112 is processed to form a silicon island, and after a sidewall is oxidized, an isolation mask is removed. Subsequently, impurities are introduced, gate oxidation is performed, further proceeding to a process of forming a gate electrode 118. Mesa-type isolation makes the isolation of a device region by merely performing an isolation process selectively on the SOI layer 112 possible, and is applied to SOI-type semiconductor apparatuses in which the SOI layer 112 is thin.

However, even if either of the separation methods illustrated in FIG. 7 and FIG. 8 is applied, due to the effect of the impurities diffused in the SOI layer 112 diffusing into the buried oxide film 113 therebelow as well, the impurity concentration in the SOI active layer becomes lower. Further, in a portion 112a where the gate electrode is in contact with the SOI layer via a thermal oxide layer, because diffusion in a lateral direction and an oblique direction occurs as well, the concentration profile of the active layer changes and becomes uneven, and a parasitic MOSFET with a low threshold voltage is formed thereat. As a result, there is a problem in that a hump occurs in the sub-threshold characteristics of the entire transistor, and good turn-off characteristics cannot be obtained.

The object of this invention lies in the prevention of concentration reduction in the SOI layer in forming the MOSFET by applying Mesa-type isolation techniques or the STI isolation method, while at the same time providing an SOI structure semiconductor apparatus improved such that a parasitic MOSFET is not formed, and a method of fabricating same.

DISCLOSURE OF THE INVENTION

In order to attain the object above, there is provided a semiconductor apparatus in which a MOS transistor is formed in a device region separated by an isolation region. This semiconductor apparatus comprises an insulation substrate, a semiconductor layer formed in a device region on the insulation substrate mentioned above, an insulation layer formed so as to cover a sidewall surface of the insulation substrate mentioned above, and is characterized in that nitrogen atoms are introduced into a portion of the surface of the insulation substrate mentioned above and the insulation layer mentioned above.

Further, there may be provided a method of fabricating a semiconductor apparatus which forms a MOS transistor in a device region separated by an isolation region on an insulation substrate. This fabrication method for a semiconductor apparatus comprises a mask step for forming an isolation mask which removes a semiconductor layer from an isolation region of the semiconductor layer on the insulation substrate, a removal step for removing the semiconductor layer from the isolation region using the isolation mask mentioned above, a nitrogen introduction step for introducing nitrogen atoms into a portion in contact with a sidewall surface of the semiconductor layer in the device region or the semiconductor layer on the insulator substrate by performing a nitridation oxidation process on the insulation substrate mentioned above, a device forming step for introducing impurities into the semiconductor layer in the device region and forming an active layer region, and a gate creation step for forming an oxide layer and an electrode in the device region mentioned above.

According to the present invention, impurity diffusion with respect to the insulation substrate at an end portion of the SOI active layer in the SOI-type semiconductor device may be suppressed.

BEST MODE FOR CARRYING OUT THE INVENTION

Embodiments of the invention are explained below with reference to the drawings.

First Embodiment

In the first embodiment, a plurality of device regions are formed in isolation by the STI method. In this isolation step, first, a semiconductor layer (SOI layer) is removed from an isolation region by etching, with a layered film of a nitride film ($Si_3N_4$) and an oxide film ($SiO_2$) as an isolation mask. Next, an SiON film is formed on a sidewall surface of the SOI layer by a nitridation oxidation process. Thereafter, isolation is performed by the STI method. Finally, an oxide film and an electrode are formed to complete a MOSFET.

Figure 1:
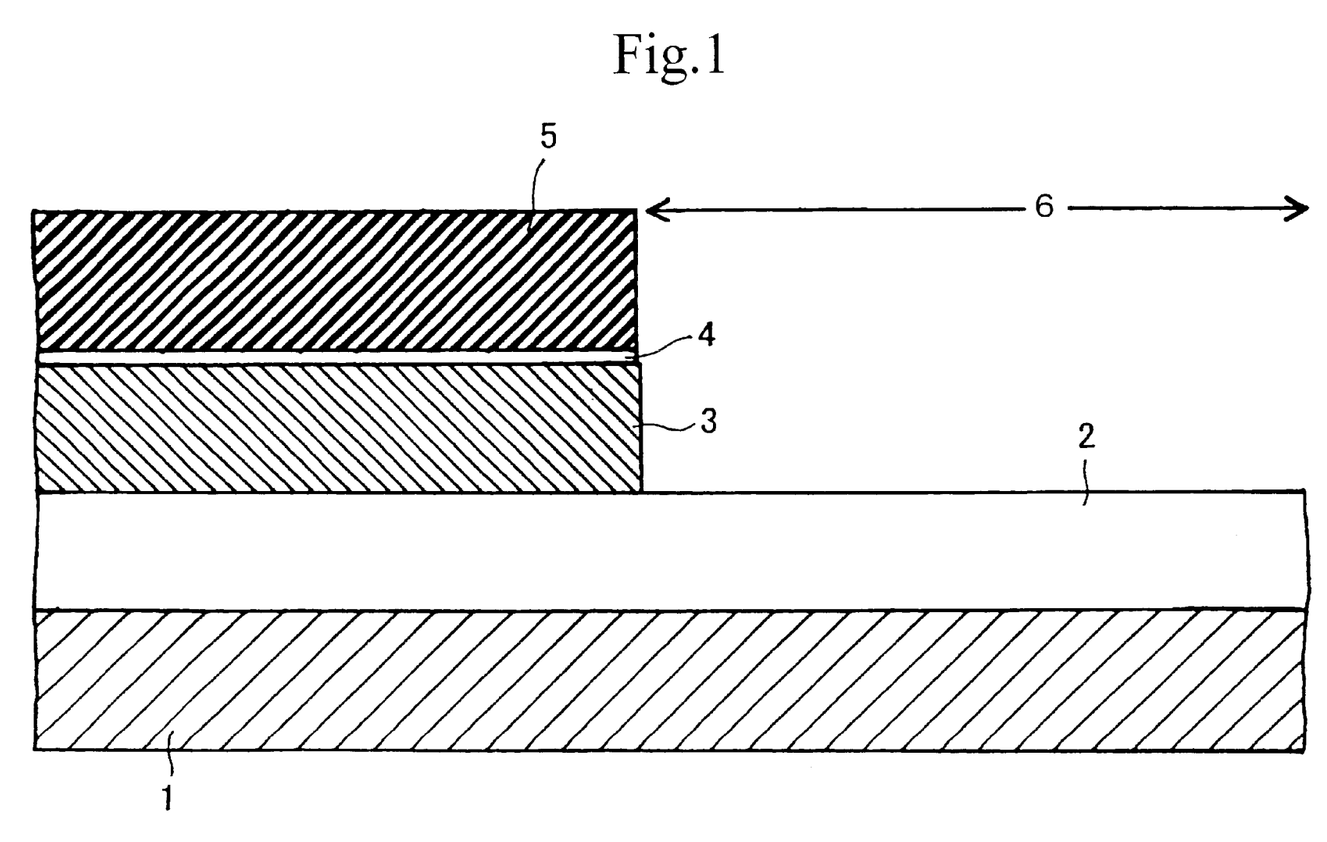
FIG. 1 is a sectional view of a semiconductor apparatus for explaining an isolation step in a first embodiment.
Figure 2:
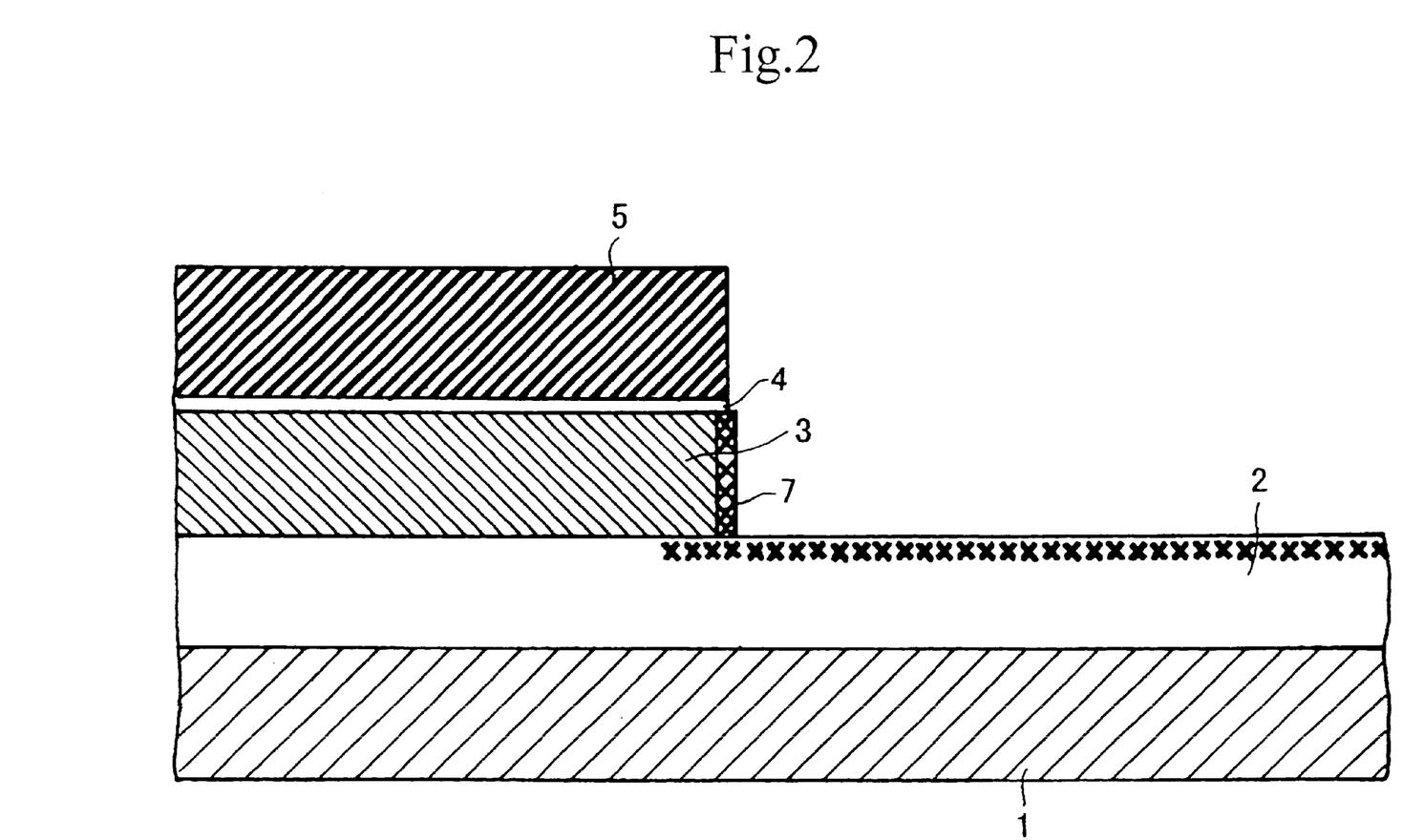
FIG. 2 is a sectional view of a semiconductor apparatus for explaining a nitrogen introduction step in the first embodiment.
Figure 3:
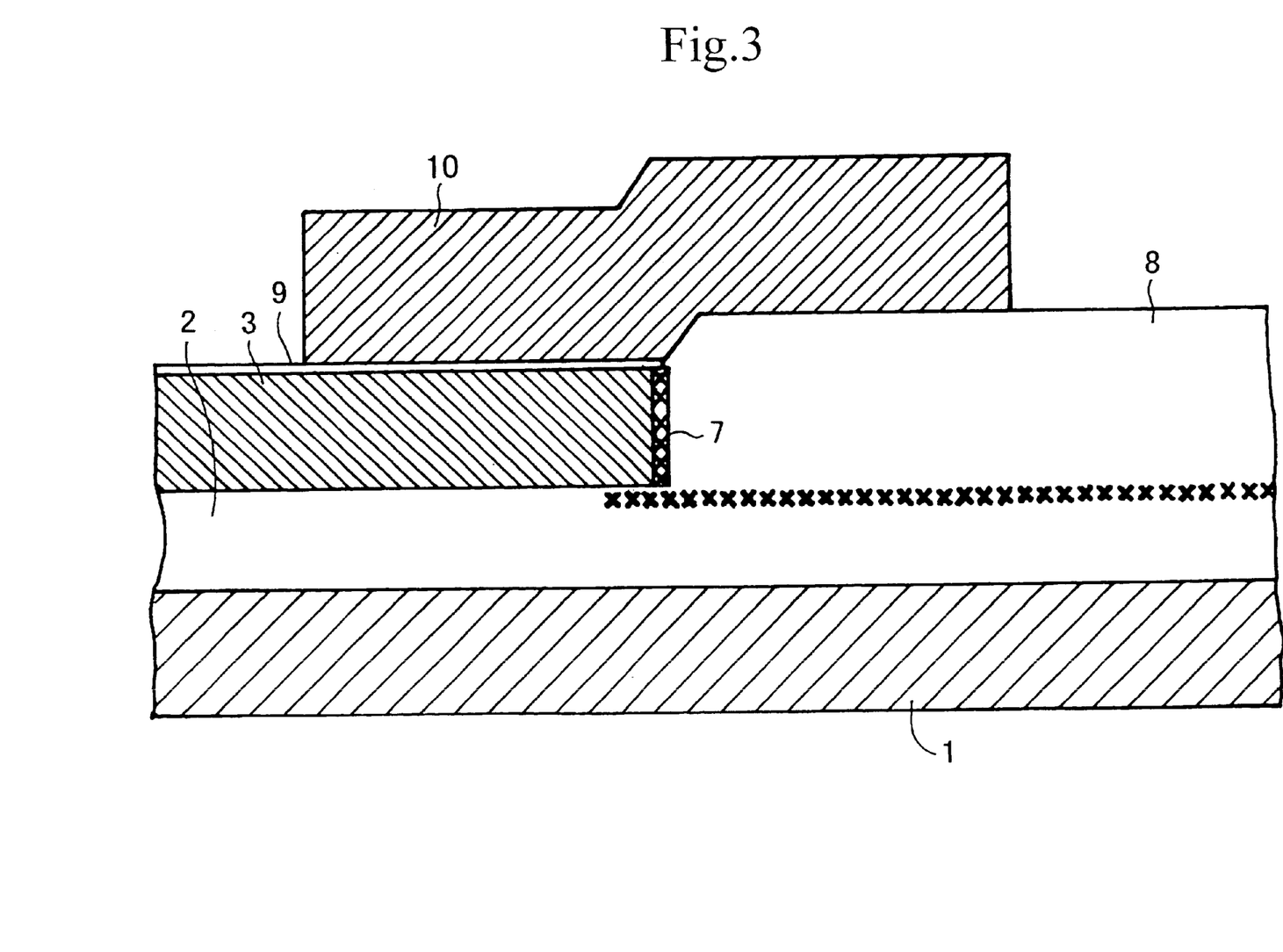
FIG. 3 is a sectional view of a semiconductor apparatus for explaining an insulation layer burying step, a device forming step and a gate creation step in the first embodiment.

FIG. 1 through FIG. 3 are process diagrams for explaining the first embodiment.

(a) Isolation Step (FIG. 1)

First, an SOI layer 3 that takes a buried oxide film ($SiO_2$) 2 as an insulation substrate is thinned on a silicon substrate 1 to a desired thickness, for example, 150 nm. Then, a thermal oxide film ($SiO_2$) 4 is formed on the surface of the SOI layer 3 at a thickness of 6 nm, and a nitride film ($Si_3N_4$) 5 of 150 nm is formed thereon by way of the low-pressure chemical vapor deposition (LP-CVD) method.

The conditions for growing the $Si_3N_4$ film by the LP-CVD method are as follows.

Gas: $SiH_2Cl_2/NH_3/N_2$ (=50/200/200 sccm)

Pressure: 70 Pa

Substrate heating temperature: 760° C.

Next, the thermal oxide film 4 and the nitride film 5 in an isolation region 6 are etched and removed by way of a lithography and dry etching processes, and the SOI layer 3 is exposed. The etching conditions for an $Si_3N_4/SiO_2$ layered film are as follows.

Gas: $CF_4/Ar$ (=100/900 sccm)

Pressure: 105 Pa

Substrate temperature: 10° C.

RF power: 600 W

Thereafter, a photo-resist is removed. Further, the SOI layer 3 in the isolation region 6 is removed through etching, which takes the nitride film 5 as a mask. The etching conditions for the SOI layer are as follows.

Gas: $C_4F_8/O_2/Ar$ (=5/4/100 sccm)

Pressure: 5.3 Pa

Substrate temperature: 10° C.

RF power: 400 W (b) Nitrogen Introduction Step (FIG. 2)

An SiON film 7 is grown on a sidewall surface of the SOI layer 3 in a thickness of 4 nm by a nitridation oxidation process. At this point, nitrogen is also introduced into the buried oxide film ($SiO_2$) 2 in contact with a peripheral portion of the SOI layer 3 (indicated with crosses in the drawing). Here, the film forming conditions for the SiON film 7 are as follows.

First Step (Pyro Ox.)

Temperature: 800° C.

Second Step (nitridation)

Gas: $NO/N_2$ (=200/3800 sccm)

Temperature: 900° C.

(c) Insulation Layer Burying Step (FIG. 3)

An oxide film ($SiO_2$) formed by the LP-CVD method is grown to, for example, 300 nm on the entire surface including the isolation region 6, and is annealed. As a result, the isolation region in which the SOI layer 3 is removed is buried in an STI insulation layer 8. The CVD oxide layer other than the isolation region is removed by chemical mechanical polishing (CMP). The nitride film 5 formed by LP-CVD in the device region is removed through a wet etching process using HOT phosphoric acid. Conditions for growing the $SiO_2$ layer by LP-CVD is as follows.

Gas: $SiH_4/O_2/N_2$ (=250/250/100 sccm)

Pressure: 13.3 Pa

Substrate heating temperature: 520° C.

Further, the annealing conditions for $SiO_2$ are as follows.

Annealing temperature: 1000° C.

Annealing time: 30 min

Further, the CMP conditions for $SiO_2$ are as follows.

Polishing pressure: 300 g/cm$^2$

Platen rotation rate: 30 rpm

Polishing head rotation rate: 30 rpm

Polishing pad: IC-100 (Product name)

Slurry: $NH_4OH$-based (contains fumed silica)

Flow rate: 1000 cc/min

Temperature: 25° C. to 30° C.

(d) Vth Adjusting Step (FIG. 3)

Various kinds of impurities are introduced into the SOI layer 3 of the device region, and an adjustment of a threshold voltage Vth in a MOSFET body section is performed. Subsequently, diluted hydrofluoric acid processing is performed to remove the thermal oxide film 4 remaining in the SOI active layer region.

(e) Gate Creation Step (FIG. 3)

After forming a gate oxide film 9 on the SOI layer 3 in the device region in a predetermined pattern, a gate electrode 10 of a predetermined form is formed by growing a polysilicon film and further by an etching process. Subsequently, necessary impurities are introduced, a source and a drain are formed, and an SOI-type MOSFET is completed. The film growing conditions for polysilicon are as follows.

Gas: $SiH_4/N_2/He$ (=100/200/400 sccm)

Pressure: 70 Pa

Substrate heating temperature: 610° C.

Further, the etching conditions for polysilicon are as follows.

Gas: $C_2Cl_3F_3/SF_6$ (=60/10. sccm)

Pressure: 1.3 Pa

Substrate temperature: 20° C.

RF power: 150 W

In the first embodiment comprising such steps (a) through (e) mentioned above, when STI isolation techniques are applied to a thick SOI layer 3 of approximately 150 nm, because the SiOn film 7 is formed by introducing nitrogen into a portion in contact with a sidewall surface of the SOI layer 3 and into the buried oxide film 2 in contact with the periphery of the SOI layer 3, at a boundary region where the gate electrode 10 crosses over to the isolation region from the SOI active layer region, diffusion of the impurities in the SOI active layer end portion into the buried oxide film 2 may be avoided. Thus, a parasitic MOS having a low threshold voltage due to a reduction in the impurity concentration may be suppressed.

Second Embodiment

In the second embodiment, isolation is performed by a Mesa-type isolation method, and a plurality of device regions are isolated and formed. In this isolation step, a semiconductor layer (SOI layer) is removed from the isolation region by etching with a layered film of a nitride film ($Si_3N_4$) and an oxide film ($SiO_2$) as an isolation mask, and is isolated in a Mesa form. Next, an SiON film is formed on a sidewall surface of the SOI layer by way of a nitridation oxidation process. Finally, an oxide film and an electrode are formed to complete a MOSFET.

Figure 4:
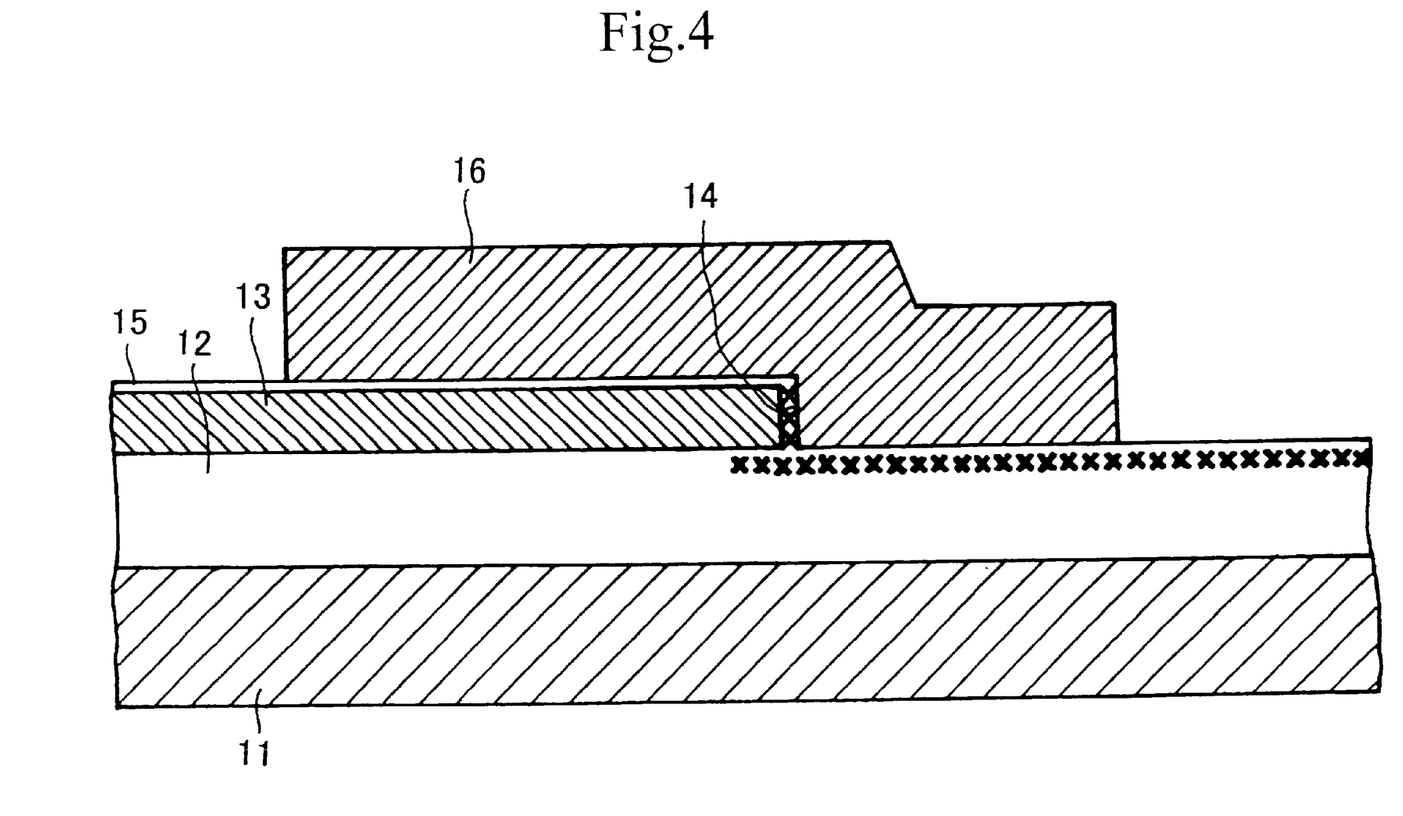
FIG. 4 is a drawing illustrating the structure of a cross-section of an SOI-type semiconductor apparatus subjected to Mesa-type isolation.

FIG. 4 is a drawing illustrating the structure of a cross-section of an SOI-type semiconductor apparatus subjected to a Mesa-type isolation.

(a) Isolation Step (FIG. 4)

First, on a silicon substrate 11, an SOI layer 13, which takes a buried oxide film ($SiO_2$) 12 as an insulation substrate, is thinned to a desired thickness, for example down to 30 nm. Thereafter, a thermal oxide film ($SiO_2$) is formed on the surface of the SOI layer 13 in a thickness of 6 nm. A nitride film ($Si_3N_4$) of a thickness of, for example, 100 nm is grown thereon by the low-pressure chemical vapor deposition (LP-CVD) method. The conditions for growing a $Si_3N_4$ film by the LP-CVD method herein is the same as those for the first embodiment.

Further, similar to the case of the STI method, a nitride film 5 and a thermal oxide film 4 of an isolation region 6 are removed by etching, thereby exposing an SOI layer 3 and removing the SOI layer 3 of an isolation region 6.

(b) Nitrogen Introduction Step (FIG. 4)

A SiON film 14 is grown to a thickness of 4 nm on a sidewall surface of the SOI layer 13 by a nitridation oxidation process. At this point, nitrogen is also introduced into the buried oxide film ($SiO_2$) 12 in contact with a peripheral portion of the SOI layer 13 (marked with crosses in the drawing). Here, the film growing conditions for the SiON film 14 in both the first and the second steps are the same as those of the first embodiment. Thereafter, the $Si_3N_4$ film 14 in the device region is removed by a wet etching process using HOT phosphoric acid.

(c) Vth Adjusting Step (FIG. 4)

Various kinds of impurities are introduced into the SOI layer 13 of the device region, and an adjustment of a threshold voltage V that a MOSFET body section is performed. Thereafter, diluted hydrofluoric acid processing is performed, and the thermal oxide film remaining in the SOI active layer region is removed.

(d) Gate Creation Step (FIG. 4)

Upon forming a gate oxide film 15 with a predetermined pattern to the SOI layer 13 of the device region, a polysilicon film is formed. Further, a gate electrode 16 of a predetermined form is formed through an etching process. Thereafter, necessary impurities are introduced, and a source and a drain are formed to complete an SOI-type MOSFET. The conditions for forming the polysilicon film and the etching conditions are the same as those in the first embodiment.

Figure 5:
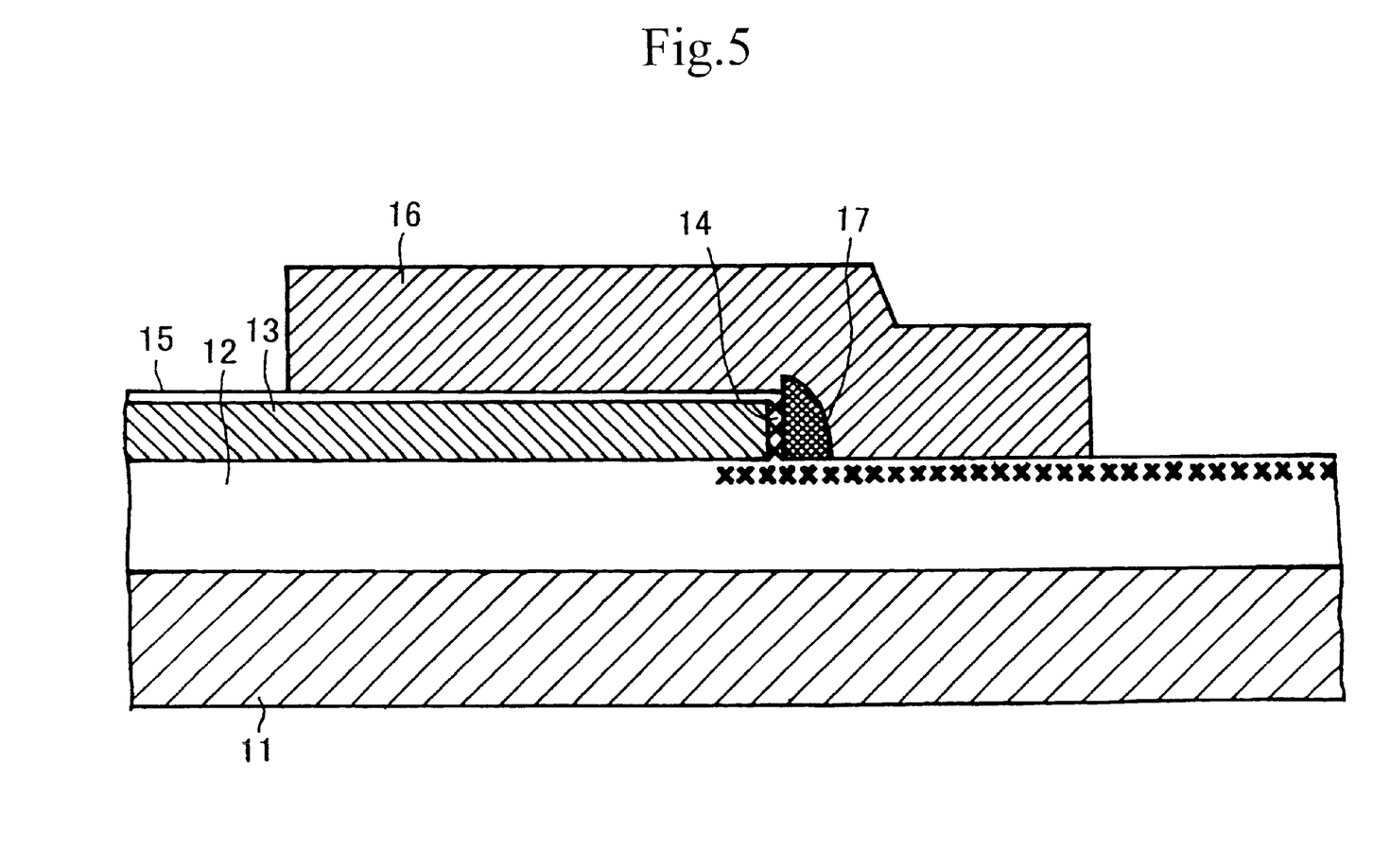
FIG. 5 is a drawing illustrating the structure of a cross-section of an SOI-type semiconductor apparatus in which a sidewall of $Si_3N_4$ is formed on a sidewall surface of an SOI layer.

FIG. 5 illustrates that in which a sidewall of $Si_3N_4$ is formed on a sidewall surface of the SOI layer before the removal of the isolation mask.

Here, following the Nitrogen Introduction Step (b) described above, a 50 nm nitride film ($Si_3N_4$) is formed by the LP-CVD method, and an etch-back process is applied. As a result, a $Si_3N_4$ sidewall 17 is formed so as to cover the SiON film 14 on the sidewall surface of the SOI layer 13. Here, the etch-back conditions for the $Si_3N_4$ film are as follows.

Gas: $CF_4/Ar$ (=50/950 sccm)

Pressure: 105 Pa

Substrate temperature: 10° C.

RF power: 200 W

In the second embodiment above comprising the steps (a) through (d), even when Mesa-type isolation techniques are applied to a thin SOI layer, because the SiON film 14 is formed by introducing nitrogen into a portion in contact with the sidewall surface of the SOI layer 3 and the buried oxide film 12 in contact with the periphery of the SOI layer, the diffusion of impurities at the end portion of the SOI active layer into the buried oxide film may be avoided in a boundary region where the gate electrode 16 crosses over from the SOI active layer region to the isolation region. Thus, a parasitic MOS with a low threshold voltage due to a reduction in impurity concentration may be suppressed.

In addition, materials for the substrate of the SOI-type semiconductor apparatus, the isolation mask, the various kinds of insulation layers, and the like are not limited to the materials explained in the embodiments described above. For example, for the substrate, various kinds of semiconductor substrates, not limited to the silicon substrate employed in the embodiments described above, may be employed. Further, for the insulation layer configuring the insulation substrate of an SOI structure, although here, a buried oxide film of $SiO_2$ is employed, $Si_3N_4$, SiN, or a layered film thereof, and further a layered film, in which insulation materials which are compounds of $SiO_2$, SiON, SiOF, or the like are added, may also be employed.

As explained above, according to the semiconductor apparatus fabrication method of the present invention, because impurity diffusion with respect to the insulation substrate at the end portion of the SOI active layer in an SOI-type semiconductor apparatus may be suppressed, the subthreshold characteristics of the entire transistor is improved by suppressing the occurrence of a parasitic MOS with a low threshold voltage due to a reduction in the impurity concentration at the transistor edge portion, and a semiconductor apparatus with good turn-off characteristics may be provided.

What is claimed is:

1. A semiconductor apparatus which forms a MOS transistor in a device region separated by an isolation region, comprising an insulation substrate, a semiconductor layer formed in a device region on said insulation substrate, and an insulation layer formed so as to cover a sidewall surface of said semiconductor layer, wherein the semiconductor apparatus is characterized in that nitrogen atoms are introduced into a portion of a surface of said insulation substrate and said insulation layer.

2. The semiconductor apparatus according to claim 1 characterized in that said semiconductor layer is silicon.

3. The semiconductor apparatus according to claim 1 characterized in that a SiON film is formed in said insulation layer.

4. The semiconductor apparatus according to claim 1 characterized in that said insulation substrate is a silicon oxide film formed on a silicon substrate.

5. The semiconductor apparatus according to claim 1 characterized in that a silicon oxide film is included in said insulation layer.

6. A method of fabricating a semiconductor apparatus which forms a MOS transistor in a device region separated by an isolation region on said insulation substrate characterized in that the method of fabricating a semiconductor apparatus comprises a mask step for forming an isolation mask for removing a semiconductor layer from an isolation region of a semiconductor layer on said insulation substrate, a removal step for removing the semiconductor layer from the isolation region using said isolation mask, a nitrogen introduction step for performing a nitridation oxidation process on said insulation substrate and introducing nitrogen atoms into a portion in contact with a sidewall surface of the semiconductor layer in said device region or the semiconductor layer on said insulation substrate, a device forming step for introducing impurities into the semiconductor layer in said device region and forming an active layer region, and a gate creation step for forming an oxide film and an electrode in said device region.

7. The method of fabricating a semiconductor apparatus according to claim 6, characterized in that the semiconductor layer on said insulation substrate is silicon, and in that the method includes a step for forming a SiON film on a sidewall surface of the semiconductor layer in said device region.

8. The method of fabricating a semiconductor apparatus according to claim 6, characterized in that following said nitrogen introduction step, the isolation region from which said semiconductor layer is removed is buried with an insulation layer, and a planarization process is applied.

9. The method of fabricating a semiconductor apparatus according to claim 6, characterized in that following said nitrogen introduction step, said isolation mask is removed, and a Mesa-type isolation is performed.

* * * * *